(12) United States Patent
Gerhardt et al.

(10) Patent No.: US 8,101,512 B2
(45) Date of Patent: Jan. 24, 2012

(54) METHOD OF ENHANCING LITHOGRAPHY CAPABILITIES DURING GATE FORMATION IN SEMICONDUCTORS HAVING A PRONOUNCED SURFACE TOPOGRAPHY

(75) Inventors: Martin Gerhardt, Dresden (DE);
Martin Trentzsch, Dresden (DE);
Markus Forsberg, Dresden (DE);
Manfred Horstmann,
Duerrroehrsdorf-Dittersbach (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 366 days.

(21) Appl. No.: 11/773,631

(22) Filed: Jul. 5, 2007

(65) Prior Publication Data

US 2008/0026552 A1    Jan. 31, 2008

(30) Foreign Application Priority Data

Jul. 31, 2006    (DE) .......................... 10 2006 035 667

(51) Int. Cl.
*H01L 21/4763* (2006.01)

(52) U.S. Cl. ........ 438/589; 438/164; 438/165; 438/296; 257/E21.495

(58) Field of Classification Search .................. 438/164, 438/165, 296, 589; 257/E21.495
See application file for complete search history.

(56) References Cited

U.S. PATENT DOCUMENTS

| | | | | |
|---|---|---|---|---|
| 5,320,972 A * | 6/1994 | Wylie | | 438/366 |
| 5,612,249 A * | 3/1997 | Sun et al. | | 438/297 |
| 6,855,607 B2 * | 2/2005 | Achuthan et al. | | 438/283 |
| 6,917,076 B2 * | 7/2005 | Eguchi et al. | | 257/340 |
| 7,183,146 B2 * | 2/2007 | Yamazaki et al. | | 438/151 |
| 7,384,849 B2 * | 6/2008 | Parekh et al. | | 438/270 |
| 2002/0173106 A1 | 11/2002 | Lee et al. | | 438/287 |
| 2003/0113970 A1 * | 6/2003 | Fried et al. | | 438/286 |
| 2004/0266077 A1 * | 12/2004 | Yeo et al. | | 438/157 |
| 2004/0266115 A1 * | 12/2004 | Chan et al. | | 438/284 |
| 2005/0110050 A1 * | 5/2005 | Walschap et al. | | 257/222 |
| 2005/0130354 A1 * | 6/2005 | Kim et al. | | 438/151 |
| 2005/0277271 A1 * | 12/2005 | Beintner et al. | | 438/478 |
| 2006/0244066 A1 * | 11/2006 | Yeo et al. | | 257/347 |
| 2007/0090456 A1 * | 4/2007 | Lee | | 257/347 |

FOREIGN PATENT DOCUMENTS

WO    WO 2004/053963    6/2004

* cited by examiner

*Primary Examiner* — Angel Roman
(74) *Attorney, Agent, or Firm* — Williams, Morgan & Amerson, P.C.

(57) ABSTRACT

In a mesa isolation configuration for forming a transistor on a semiconductor island, an additional planarization step is performed to enhance the uniformity of the gate patterning process. In some illustrative embodiments, the gate electrode material may be planarized, for instance, on the basis of CMP, to compensate for the highly non-uniform surface topography, when the gate electrode material is formed above the non-filled isolation trenches. Consequently, significant advantages of the mesa isolation strategy may be combined with a high degree of scalability due to the enhancement of the critical gate patterning process.

20 Claims, 8 Drawing Sheets

METHOD OF ENHANCING LITHOGRAPHY CAPABILITIES DURING GATE FORMATION IN SEMICONDUCTORS HAVING A PRONOUNCED SURFACE TOPOGRAPHY

BACKGROUND OF THE INVENTION

1. Field of the Invention

Generally, the present disclosure relates to the field of fabrication of integrated circuits, and, more particularly, to semiconductor devices having conductive lines, such as gate electrodes of field effect transistors, which are formed on a pronounced surface topography.

2. Description of the Related Art

In modern ultra-high density integrated circuits, device features are steadily decreased to enhance device performance and functionality. One important circuit element in complex integrated circuits is a field effect transistor, which represents a component having a channel region, whose conductivity may be controlled by an electric field that is generated by applying a control voltage to a gate electrode formed near the channel region and separated therefrom by a gate insulation layer. The channel region is generally defined by respective PN junctions formed by an interface of highly doped drain and source regions and an inversely doped region located between the drain and source regions. Important characteristics for the performance of an integrated circuit are, among others, the switching speed of the individual transistor elements and the drive current capability. Thus, one important aspect for obtaining a high transistor performance is the reduction of the overall resistance of the current path defined by the channel region, the resistance of the drain and source regions and the respective contacts that connect the transistor with peripheral devices, such as other transistors, capacitors and the like. The reduction of the channel length thus provides reduced resistance of the channel region and also offers the potential to increase the packing density of the integrated circuit. Upon reducing the transistor dimension, the transistor width is typically also reduced in view of packing density and switching speed, which may, however, reduce the drive current capability. It is therefore of great importance to reduce the series resistance of a transistor for given design dimensions as much as possible so as to combine moderately high drive current capability with increased switching speed for sophisticated logic circuits.

Hence, it has become an important design target to increase the conductivity of lines and contact regions, such as drain and source regions, gate electrodes, polysilicon interconnect lines and the like, since the cross-sectional area of these lines and regions is also reduced as the general transistor dimensions are decreased. The cross-sectional area, however, determines, in combination with the characteristics of the material comprising the conductive lines and contact regions, the resistance of the respective line or contact region. As a result, in highly scaled semiconductor devices, the conductive lines and contact regions may exhibit a higher resistance unless the reduced cross-section is compensated for by improving the electrical characteristics of the material forming the lines and contact regions, such as the gate electrode, and the drain and source contact regions.

Hence, in combination with precisely defining the gate electrodes or other conductive lines in the device level, it is also of great importance to improve the characteristics of conductive regions that are substantially comprised of semiconductor material such as silicon. For instance, in modern integrated circuits, the individual semiconductor devices, such as field effect transistors, capacitors and the like, are primarily based on silicon, wherein the individual devices are connected by polysilicon lines and metal lines. While the resistivity of the metal lines may be improved by replacing the commonly used aluminum by, for example, copper and copper alloys, process engineers are confronted with a challenging task when an improvement in the electrical characteristics of silicon-containing semiconductor lines and semiconductor contact regions is required.

In some approaches, some structural aspects may be realized in a transistor architecture to achieve a significant improvement in one or more of the above aspects. For instance, in modern semiconductor devices, silicon-on-insulator (SOI) architecture may frequently be used due to some inherent advantages of an SOI transistor with respect to a bulk device, such as reduced junction capacity, increased degree of insulation to neighboring devices and the like. Furthermore, in SOI devices, isolation trenches are typically provided, which in some approaches may not be refilled with an insulating material prior to the gate patterning in order to obtain, in addition to a process flow of reduced complexity, significant advantages with respect to increased drive current capability. For example, due to the missing fill material in the isolation trenches during the gate patterning process, the gate insulation material and the gate electrode material may also be formed at the end portions of the gate electrode with respect to the transistor width direction, thereby enabling the creation of the conductive channel in a highly efficient manner across the entire width dimension of the transistor. Consequently, an efficient charge carrier transport may occur even at the end portions, which, in devices having a filled isolation trench, may be significantly reduced at these channel areas due to a reduced capacitive coupling to the gate electrode. Similarly, in a respective configuration with a missing insulating material at this manufacturing stage, which is also referred to as "mesa isolation," the formation of metal silicides, provided for increasing the conductivity of the semiconductor material, may be enhanced at these end portions of the channel, thereby also reducing the overall series resistance of the transistor.

Although a plurality of advantages may be associated with the above-described approach, the precise patterning of the gate electrode may be significantly compromised by the corresponding pronounced surface topography of the device surface prior to and during the patterning process, in particular when highly scaled transistors are considered. As is well known, optical lithography processes rely on the characteristics of the imaging process for transferring an image into a resist material in order to form a latent image in the resist material, which may then be developed to obtain a resist mask, on the basis of which the gate electrode material may be patterned. For highly sophisticated applications, however, any surface variations may have a negative influence, since, for instance, the depth of focus of modern lithography tools is typically reduced with a reduction of exposure wavelength. Moreover, the resist materials for reduced exposure wavelength may have to be provided with reduced thickness, thereby also increasing the sensitivity to the surface topography. Hence, the potential advantages provided by the above-described process flow for forming a mesa isolation may be partially or completely offset by process non-uniformities during the patterning of the gate electrodes, in particular for highly scaled devices, thereby rendering the conventional mesa isolation approach less attractive.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique that enables the formation of semiconductor lines, such as gate electrodes, on the basis of an advanced lithography process with enhanced surface topography, while, at the same time, a device architecture including non-filled isolation trenches may be provided. For this purpose, the pronounced surface topography resulting from the deposition of a material layer above a structured semiconductor "island" may be efficiently planarized prior to performing further patterning steps for obtaining a conductive semiconductor line, such as a gate electrode, from the previously formed material layer. In other aspects, an isolation trench may be formed after the patterning of a gate electrode, thereby providing an enhanced surface topography for the patterning process of the gate electrode, while the isolation trench may also be formed on the basis of a planarized surface topography, thereby providing enhanced lithography conditions for the trench patterning process.

According to one illustrative embodiment disclosed herein, a method comprises forming an isolation trench to define an active semiconductor area in a semiconductor layer that is formed above the substrate. The method further comprises forming a gate electrode material above the active semiconductor area and above the isolation trench. Thereafter, a resulting surface topography is planarized and a gate electrode is patterned from the gate electrode material on the basis of the planarized surface topography.

According to another illustrative embodiment disclosed herein, a method comprises forming a gate electrode above a semiconductor layer that is formed above a substrate. Furthermore, the resulting surface topography is planarized and an isolation trench is subsequently formed in the semiconductor layer to define an active semiconductor area for the gate electrode.

According to yet another illustrative embodiment disclosed herein, a method comprises forming a material layer above an active semiconductor area defined by an isolation trench formed in a semiconductor layer, wherein the material layer comprises a gate electrode material. Next, the material layer is planarized to provide a substantially planar surface topography and, finally, the planarized material layer is patterned in order to form a gate electrode above the active semiconductor area.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates an efficient process flow for forming semiconductor lines, such as gate electrodes, in combination with a transistor architecture including non-filled and/or only partially filled isolation trenches, at least at certain manufacturing stages, for providing isolated semiconductor islands, wherein the respective semiconductor lines or gate electrodes may nevertheless be patterned on the basis of an enhanced surface topography, thereby enabling a high degree of scalability of these process techniques while still maintaining at least some of the advantages obtained by the mesa isolation technique. In one approach, a respective enhancement of the surface topography prior to patterning the gate electrode may be achieved by introducing at least one additional planarization process prior to performing a lithography process, wherein the planarization may be performed directly on the gate electrode material and/or on the basis of an additional sacrificial material, when a high degree of compatibility with conventional process strategies may be desired. For example, the gate electrode material, deposited on the basis of a pronounced surface topography, may be planarized by a local material removal so as to provide the desired target height of the material above the semiconductor island, which may be accomplished on the basis of chemical mechanical polishing (CMP) techniques, appropriately designed etch techniques and the like. In other cases, a sacrificial material may be provided in a highly non-conformal condition in order to equalize the surface topography of the underlying gate electrode material. In still other illustrative embodiments, in addition to the provision of a highly non-conformal sacrificial material, a further planarization step may be performed to even further enhance the resulting surface topography prior to the subsequent gate patterning process. In other approaches, the gate patterning process and the formation of the isolation trench may be performed in an appropriate sequence such that a respective semiconductor island may be formed after the gate patterning process, thereby providing a respective mesa region for the drain and source regions as well as along the entire width extension of the gate electrode. Although, in this case, the improvements with respect to increasing the effective transistor width may be less pronounced compared to the above-described approaches, nevertheless a recessed transistor configuration may be obtained in a highly efficient manner, so that a corresponding stressed overlayer, as may typically be provided after the completion of the transistor, may exert a respective stress in a highly efficient manner which may, therefore, enhance the strain in the respective channel region. In this case, at least the gate patterning process may be performed on the basis of well-established techniques without requiring additional process steps, thereby providing a high degree of compatibility. Consequently, at least some advantages of a recessed transistor configuration may be obtained while nevertheless providing excellent surface topography during the gate patterning process.

Figure 1A:
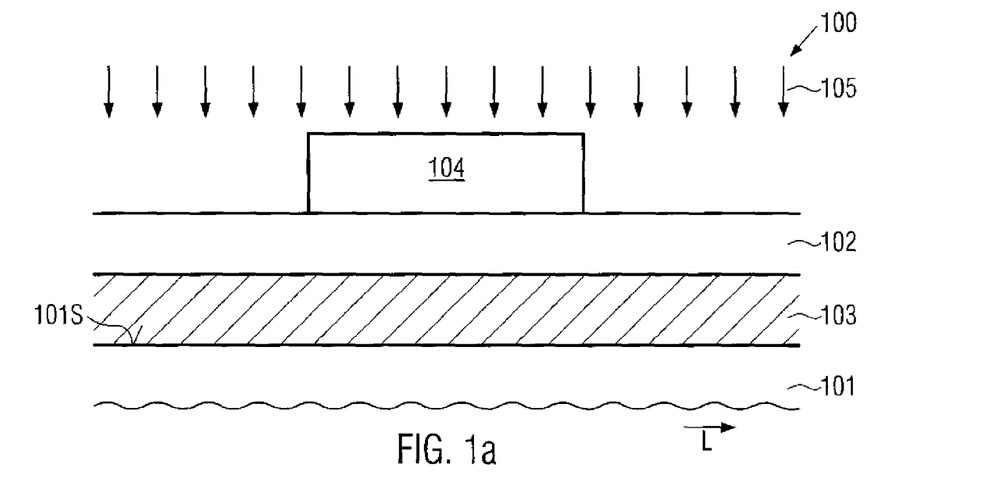
FIGS. 1a-1f schematically illustrate cross-sectional views of a semiconductor device in the transistor length direction during the formation of a gate electrode on the basis of a mesa isolation with enhanced surface topography according to illustrative embodiments disclosed herein.

FIG. 1a schematically illustrates a cross-sectional view of a semiconductor device 100, wherein the section is taken along a transistor length direction, as indicated in FIG. 1a. The semiconductor device 100 may comprise, in this manufacturing stage, a substrate 101 which may represent any appropriate carrier material for forming thereon circuit elements, such as field effect transistors, capacitors and the like. For example, the substrate 101 may represent a semiconductor material, such as silicon or any other appropriate semiconductor material, above which may be formed a crystalline semiconductor layer 102 having a crystalline configuration as required for the formation of respective circuit elements therein and thereon. For example, the semiconductor layer 102 may represent a silicon-based crystalline layer, since the majority of complex logic circuitry is presently and will be in the near future formed on the basis of silicon due to the advantages with respect to availability, know how and the like. It should be appreciated that a silicon-based semiconductor material is to be considered as a material comprising a significant amount of silicon, for instance more than approximately 50 atomic percent, wherein other materials, such as carbon, germanium and the like, may be present in a more or less amount, depending on the device requirements. Furthermore, the crystalline orientation of the layer 102 may also be provided with respect to device requirements. It should be appreciated that the semiconductor layer 102 may have locally varying material characteristics, for instance with respect to the amount of non-silicon atoms for obtaining specific stress and strain conditions in respective portions of the layer 102 and/or with respect to a desired crystallographic orientation and the like. It should also be noted that the semiconductor layer 102 may represent other appropriate semiconductor materials, depending on the process requirements. In one illustrative embodiment, the substrate 101 comprises a buried insulating layer 103 located between a surface 101S of the base material of the substrate 101 and the semiconductor layer 102. The buried insulating layer 103 may be comprised of any appropriate material, such as silicon dioxide, silicon nitride, a combination thereof and the like, depending on the device requirements. In the following, a respective configuration comprised of the substrate 101, the buried insulating layer 103 and the semiconductor layer 102 may be referred to as an SOI configuration. It should be appreciated that respective material characteristics and dimensions of the layers 103 and 102 may be selected on the basis of the device requirements, wherein, for instance, for highly sophisticated transistor elements formed according to an SOI architecture, a thickness of the semiconductor layer 102 may range from several nanometers to several hundred nanometers, while a thickness of the buried insulating layer 103 may range from 100 to several hundred nanometers or even more. In other illustrative embodiments, the semiconductor layer 102 may be directly formed on the substrate 101, which may then typically comprise a substantially crystalline base material so as to form a bulk configuration.

Furthermore, the semiconductor device 100 may further comprise an etch mask 104 formed above the semiconductor layer 102 so as to expose portions of the layer 102, which are to be removed in order to provide an isolated semiconductor area, in which one or more circuit elements are to be formed. The etch mask 104 may be comprised of any appropriate material that provides the desired etch resistivity during a substantially anisotropic etch process 105, which may include a highly selective etch chemistry on the basis of well-established recipes in order to efficiently remove material of the layer 102 while exhibiting a significantly reduced etch rate for the material of the etch mask 104. It should be appreciated that the etch mask 104 may itself comprise different materials (not shown), such as an etch stop layer and the like, in order to facilitate the subsequent removal of the etch mask 104.

A typical process flow for forming the semiconductor device 100 as shown in FIG. 1a may comprise the following processes. After providing the substrate 101, which may already include the buried insulating layer 103, if provided, and the semiconductor layer 102, the etch mask 104 may be formed on the basis of well-established techniques including, for instance, photolithography techniques for patterning a resist mask, which may represent the etch mask 104, when the resist material may provide sufficient etch resistance during the process 105. In other cases, a respective resist mask (not shown) may be formed on the basis of a lithography process in order to pattern a respective mask material for obtaining the etch mask 104. Thereafter, the process 105 may be performed on the basis of well-established etch chemistries, wherein the process may also be selective to the insulating layer 103, if provided, which may therefore be used as an efficient etch stop layer for appropriately controlling the process 105.

Figure 1B:
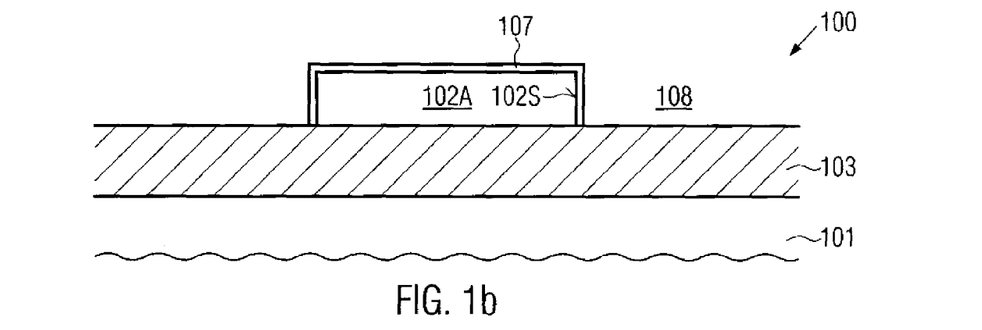

FIG. 1b schematically illustrates the semiconductor device 100 in a further advanced manufacturing stage. An active semiconductor area 102A, which may also be referred to as a semiconductor island, may be defined by respective isolation trenches 108 previously formed by the etch process 105. The isolation trench 108 may extend down to the buried insulating layer 103, when an SOI configuration is considered, while, in other illustrative embodiments, the isolation trench 108 may be formed within the semiconductor layer 102 to a specified depth. Furthermore, in this manufacturing stage, a gate insulation layer 107 may be formed on exposed surfaces of the active area 102A, wherein the gate insulation layer 107 may be comprised of any appropriate material. For example, in silicon-based semiconductor devices, frequently silicon dioxide, silicon nitride, silicon oxynitride and the like may be used as an insulating material with a thickness in the range of 1 nm to several nanometers, depending on the device requirements. In other cases, any other appropriate materials, such as high-K materials and the like, may be used. The gate insulation layer 107 may be formed on the basis of well-established techniques, such as thermal and/or chemical oxidation, deposition or any combination thereof. It should be appreciated that, due to the non-filled isolation trenches 108, exposed sidewall portions 102S of the area 102A may also be covered by the gate insulation layer 107.

Figure 1C:
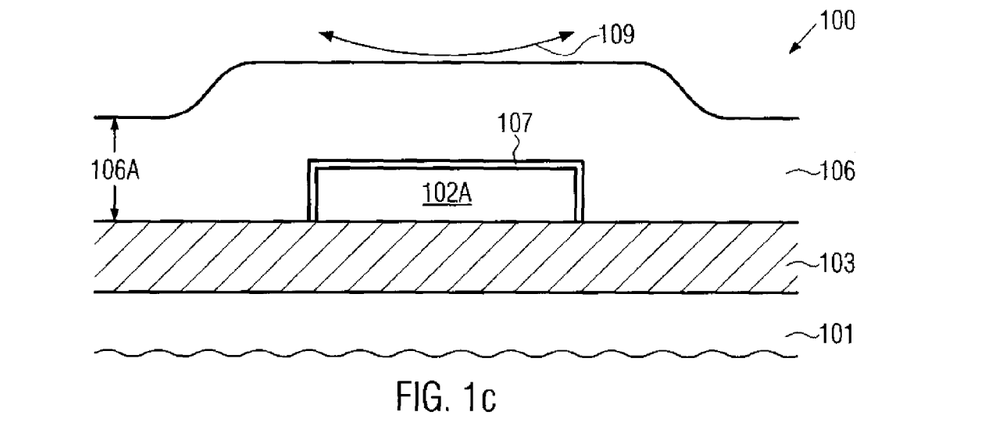

FIG. 1c schematically illustrates the semiconductor device 100 having formed thereon a layer 106 of gate electrode material, which, in one illustrative embodiment, may comprise polysilicon, which may be provided in a non-doped or doped form. The layer of gate electrode material 106 may be provided with a specific thickness 106A, which is appropriately selected to enable a subsequent planarization process 109 in order to selectively remove excess material from the layer 106 while still maintaining a desired target thickness above the active area 102A. The layer 106 may be formed on the basis of any appropriate deposition process, such as low pressure chemical vapor deposition (LPCVD), when, for instance, a polycrystalline silicon material is to be deposited. It should be appreciated that, due to the previously non-filled isolation trenches 108, a significant surface topography may be generated by the deposition of the layer 106, which may, in conventional techniques, significantly affect further manufacturing processes for patterning a gate electrode from the layer 106, as is previously explained. Consequently, the planarization process 109 may be performed to obtain a substantially planar surface topography prior to the patterning process for forming a respective gate electrode. In one illustrative embodiment, the planarization process 109 may comprise a chemical mechanical polishing (CMP) process, during which elevated portions of the layer 106 may be reliably removed due to an increased removal rate compared to areas of reduced height that correspond to the isolation trenches 108.

Figure 1D:
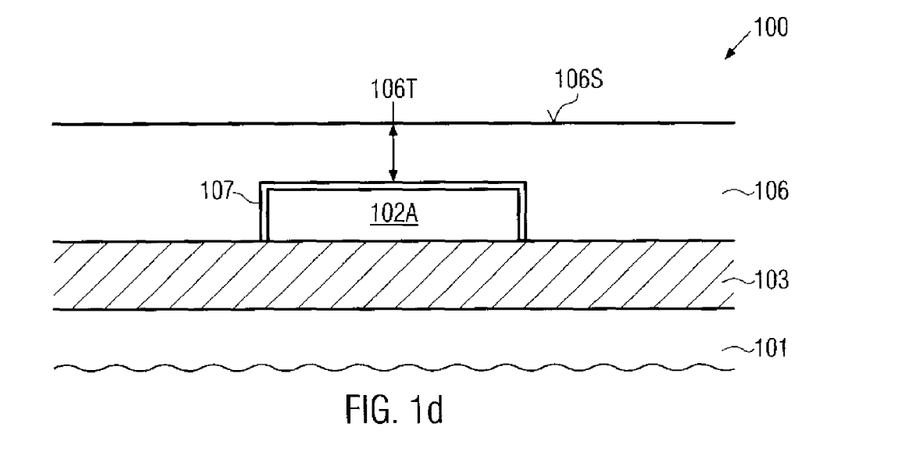

FIG. 1d schematically illustrates the semiconductor device 100 after the completion of the planarization process 109, thereby providing a substantially planar surface topography, indicated as 106S, wherein a respective thickness of the layer 106 above the active area 102A substantially corresponds to the target thickness 106T of a gate electrode to be formed from the planarized layer 106. In one illustrative embodiment, the layer 106 as shown in FIG. 1c may be deposited with the thickness 106A, which may be selected so as to allow a reliable removal of excess material in order to obtain a substantially planarized surface by the planarization process 109, wherein, based on the planarized surface, an additional deposition step may be subsequently performed in order to obtain the desired target thickness 106T, as shown in FIG. 1d. In this case, the control of the preceding planarization process 109 may be significantly relaxed and may allow an increased process window, wherein subsequently, based on respective thickness measurements, the required additional material thickness in a subsequent deposition process may be reliably determined to provide an appropriate control parameter for the additional deposition process. Consequently, even in highly critical applications, the desired target thickness 106T may be obtained substantially without significant dependence on the preceding planarization process 109. In other illustrative embodiments, an additional CMP control layer (not shown) may be provided on top of the layer 106 prior to the planarization process 109, wherein the control layer may have significantly different polishing characteristics compared to the material of the layer 106. Due to the pronounced surface topography, the respective control layer may be efficiently removed from elevated portions of the gate electrode material 106, while the control layer may be substantially maintained in areas of reduced height. Consequently, upon removing elevated portions of the material 106, thereby increasingly equalizing the different height levels, an appropriate endpoint signal may be obtained during the polishing process when a height level is reached that substantially corresponds to the height level of the neighboring control layer having the significantly different polishing characteristics. Subsequently, the remaining CMP control layer may or may not be removed, depending on the further process requirements.

Again referring to FIG. 1d, after planarizing the layer 106 for obtaining the enhanced surface topography 106S, in some illustrative embodiments, respective cleaning processes may be performed in order to reduce possible CMP-induced contamination, such as particles and the like. Thereafter, the remaining layer 106 may be prepared for a subsequent lithography process. For example, an anti-reflective coating (ARC) layer 111 may be formed in combination with an appropriate resist material, which may be subsequently exposed to a specific exposure wavelength in order to define a respective resist feature for patterning a gate electrode above the active are 102A on the basis of well-established process techniques.

Figure 1E:
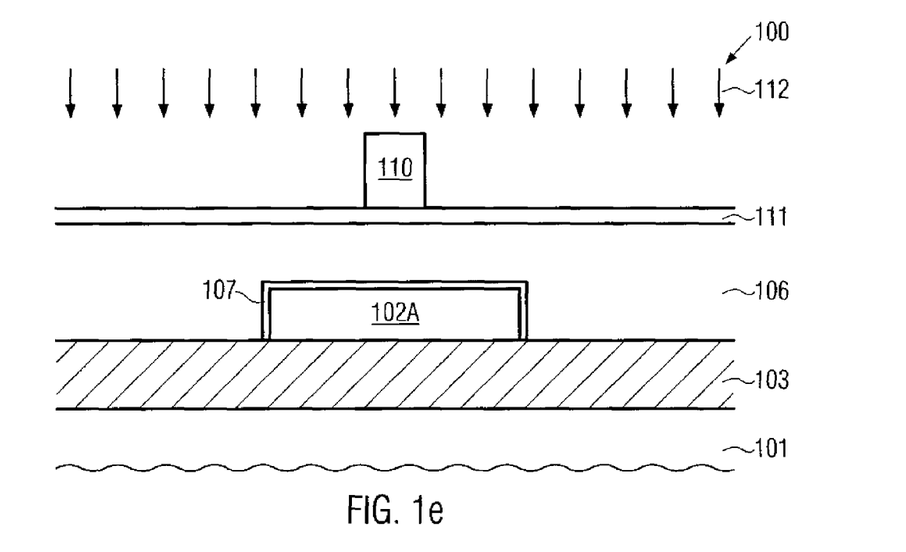

FIG. 1e schematically illustrates the semiconductor device 100 in a further advanced manufacturing stage. A resist feature 110 may be formed on a respective ARC layer 111, which may be exposed to a specific etch ambient 112 in order to transfer the resist feature 110 into the ARC layer 111 and subsequently into the layer 106 to define a respective gate electrode therein. It should be appreciated that the etch process 112 may also comprise respective etch trim steps for reducing the dimensions of the resist feature 110 prior to actually using the feature 110 as an etch mask for patterning the layer 106. It also should be noted that during the preceding lithography process and during the critical etch process 112, a significantly enhanced resolution of the entire patterning process may be achieved, since the planarized surface topography 106S significantly reduces any step heights, which may adversely affect the patterning process and, thus, the uniformity of the resulting gate electrodes in the conventional process technique based on the mesa isolation regime as is previously explained.

Figure 1F:
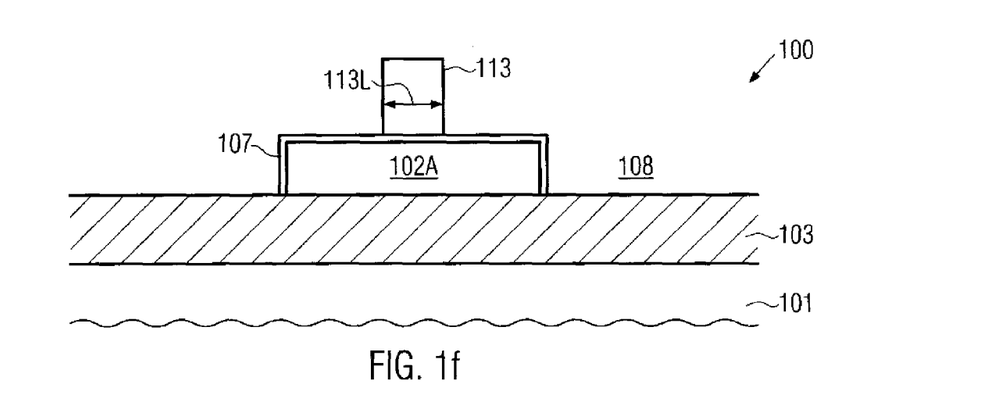

FIG. 1f schematically illustrates the device 100 after the etch process 112, thereby leaving a gate electrode 113 having a lateral dimension in the transistor length direction, also indicated as gate length 113L, which is substantially defined by the preceding photolithography process and the respective etch process 112. Moreover, a high degree of pattern uniformity in the transistor width direction may also be achieved as will described with reference to FIG. 1g below. In the illustrative embodiment shown, the etch process 112 may be performed in such a way that the respective isolation trenches 108 may be exposed down to the buried insulating layer 103. In other illustrative embodiments, a portion of the gate electrode material 106 may still be contained within the isolation trenches 108, when the required over-etch time for completely removing the gate electrode material 106 from the isolation trenches 108 is considered inappropriate in view of a possible etch damage of the active area 102A.

Figure 1G:
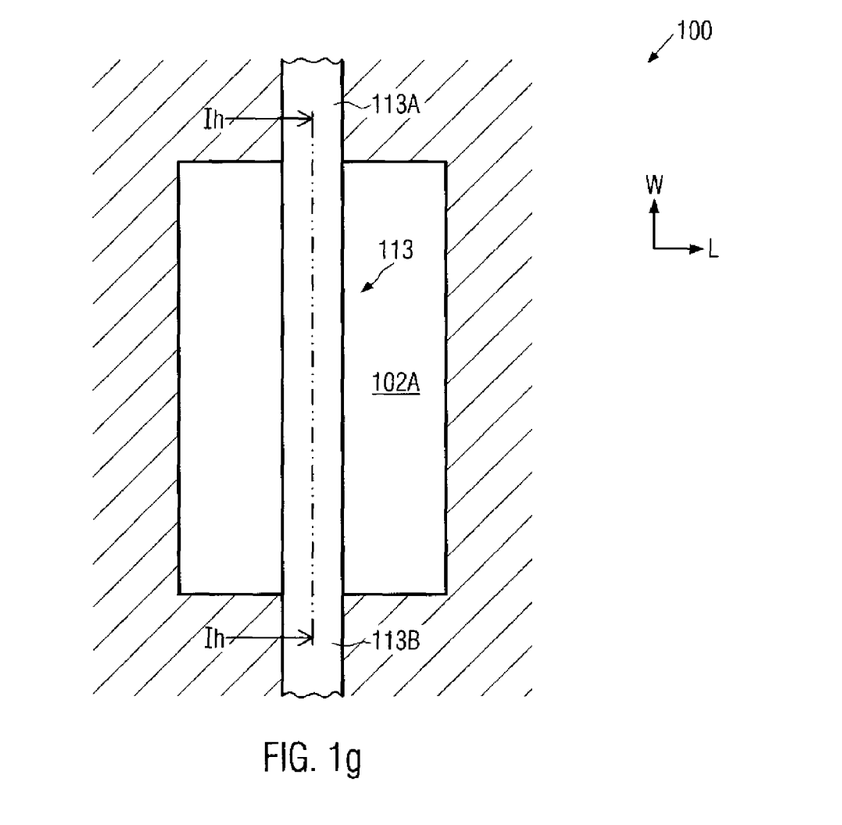
FIG. 1g schematically illustrates a top view of the device illustrated in the previous drawings.

FIG. 1g schematically illustrates the semiconductor device 100 in a top view according to the manufacturing stage as shown in FIG. 1f. Thus, the gate electrode 113 may extend along the transistor width direction W, as indicated in FIG. 1g, wherein respective portions of the gate electrode 113, indicated as 113A, 113B, may extend beyond a respective isolation area defined by the isolation trench 108. For example, one of the portions 113A, 113B may connect to a respective contact area (not shown) of the gate electrode 113 or may connect to a respective gate electrode portion of a further transistor element and the like. Due to the mesa configuration of the active area 102A, in conventional techniques, a significant change of the surface topography at the portions 113A, 113B may lead to significant process non-uniformities, which, according to the subject matter disclosed herein, may be substantially avoided, thereby significantly enhancing the applicability of the mesa isolation regime in view of a further reduction of a transistor dimension in the length and width direction.

Figure 1H:
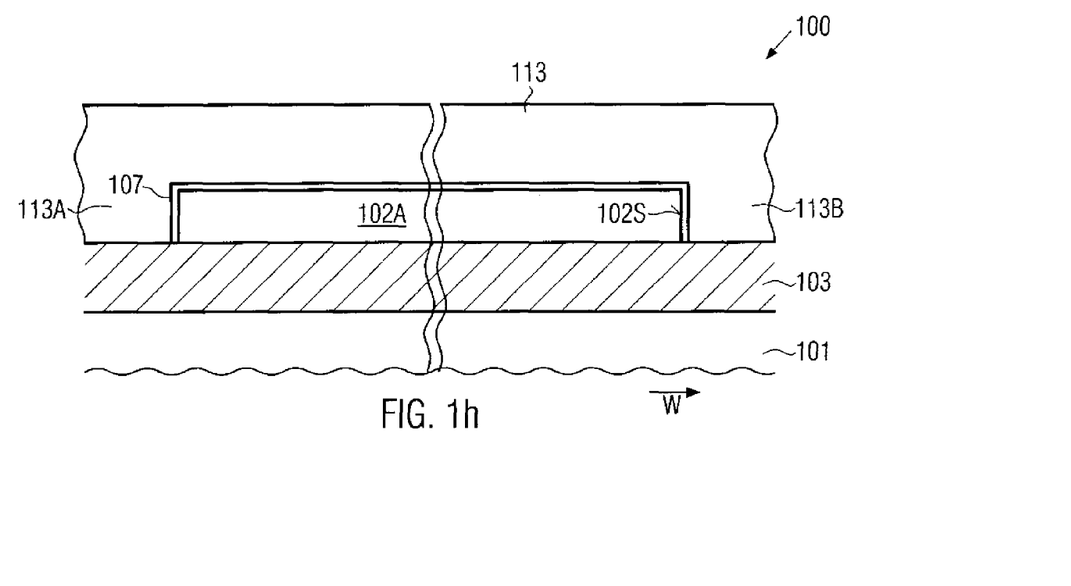
FIG. 1h schematically illustrates a cross-sectional view along the transistor width direction as indicated in FIG. 1g.

FIG. 1h schematically illustrates a sectional view along the line as indicated in FIG. 1g. As is evident from the drawing, the respective end portions 113A, 113B may be formed adjacent to the respective portion of the gate insulation layer 107, thereby also increasing the effective channel width, since a high degree of channel controllability is also obtained at the respective sidewall portions 102S of the active area 102A, while a corresponding patterning process of this specific position, which is highly critical in conventional regimes, may not result in a respective process non-uniformity and, thus, a performance nonuniformity. Consequently, the advantages provided by the mesa isolation technique may be obtained while substantially avoiding pattern non-uniformities typically associated with conventional techniques, thereby enabling the application of this isolation configuration on highly scaled semiconductor devices.

Figure 1I:
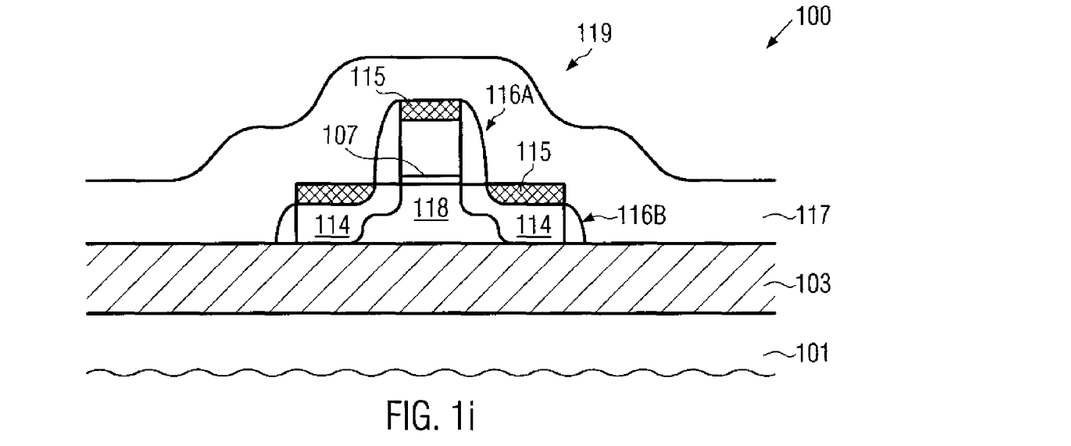
FIG. 1i schematically illustrates a cross-sectional view in the transistor length direction of a transistor element in a further advanced manufacturing stage according to illustrative embodiments.

FIG. 1i schematically illustrates a cross sectional view along the transistor length direction L of the device 100 in a further advanced manufacturing stage. The device 100 may comprise a transistor 119 including drain and source regions 114 formed within the active area 102A. Furthermore, respective metal silicide regions 115 may be formed in the drain and source regions 114 and may also be provided in the gate electrode 113. Moreover, a sidewall spacer structure 116A may be formed on sidewalls of the gate electrode 113, while a similar spacer structure 116B may also be formed on the sidewalls 102S of the active area 102A. Furthermore, a cover layer 117, which in some illustrative embodiments may be provided in the form of a contact etch stop layer that may be used as an etch stop in a subsequent process for forming contact openings to respective contact areas of the device 100, may be provided so as to enclose the gate electrode 113 and the active area 102A. In one illustrative embodiment, the cover layer 117 may be provided as a highly stressed layer in order to induce a respective strain in a channel region 118 of the transistor 119 defined by the gate electrode structure 113 including the gate insulation layer 107 and the active area 102A. For instance, the transistor 119 may represent an N-channel transistor so that the intrinsic stress in the overlayer 117 may be selected so as to increase the mobility of electrons in the channel region 118. For instance, by taking into consideration the crystallographic characteristics of the material of the active area 102A, a specific type and magnitude of intrinsic stress of the overlayer 117 may create the appropriate type of strain in the channel region 118 for obtaining a significant increase of electron mobility. For example, for a silicon-based material and a crystallographic surface orientation (100), a significant increase in electron mobility may be obtained by providing a high tensile stress in the overlayer 117. For the same crystallographic orientation, a significant enhancement in hole mobility may be obtained for a P-channel transistor when the overlayer 117 comprises a high compressive stress. It should be appreciated that, due to the recessed configuration, that is, due to the previously non-filled isolation trenches 108, a significant portion of the material of the overlayer 117 may substantially directly act on the respective sidewall potions 102S, thereby significantly enhancing the strain-inducing mechanism provided by the stressed overlayer 117. Since the generation of a respective strain in channel region 118 may significantly contribute to the overall performance enhancement of the transistor 119, the mesa isolation regime may thus be advantageously applied to highly scaled devices, which typically require highly efficient strain-inducing mechanisms.

The device 100 as shown in FIG. 1i may be formed on the basis of well established techniques, including the deposition of respective spacer and etch stop layers, which may be subsequently patterned on the basis of well-established anisotropic etch techniques, thereby forming the spacer structures 116A, 116B. Based on a respective manufacturing stage of the spacer structure 116A, 116B, appropriate implantation processes may be performed in order to obtain the drain and source regions 114 having the desired lateral and vertical dopant profile. Appropriate anneal processes may be performed to activate the implanted dopants and well-established silicidation techniques may be used for forming the regions 115.

With reference to FIGS. 2a-2d, further illustrative embodiments of the present invention will now be described in more detail, wherein a sacrificial layer is formed above the respective gate electrode material in order to provide an enhanced surface topography.

Figure 2A:
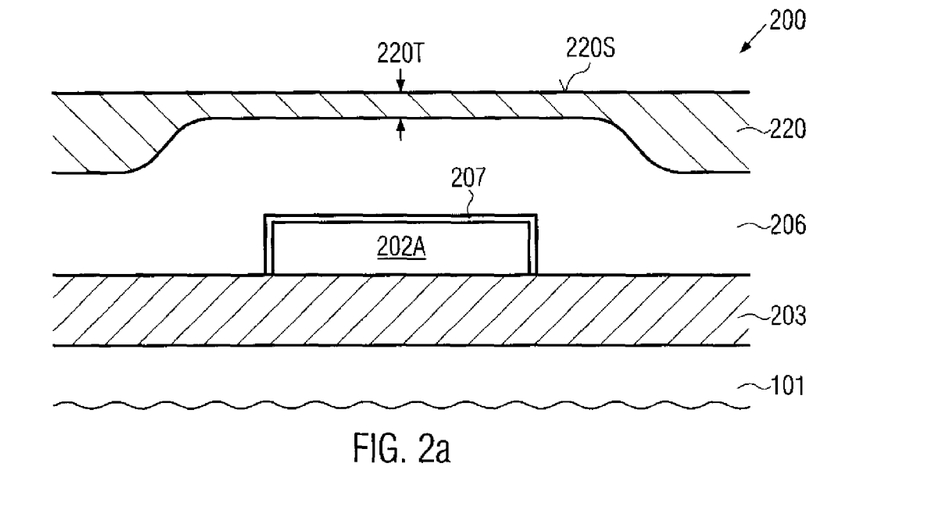
FIG. 2a schematically illustrates a cross-sectional view of a transistor element having a semiconductor island in a manufacturing stage for patterning a gate electrode on the basis of a planar sacrificial material according to other illustrative embodiments.

FIG. 2a schematically illustrates a semiconductor device 200 having a substrate 201, which may have formed thereon a buried insulating layer 203, on which may be formed an active semiconductor area 202A, surface portions of which may be covered by a gate insulation layer 207. Furthermore, a layer of gate electrode material 206 is formed above the substrate 201 and exhibits, in this manufacturing stage, a pronounced surface topography due to the semiconductor area 202A. With respect to the components 201, 203, 202A, 207 and 206 of the device 200, the same criteria apply as previously explained with reference to the device 100. Moreover, the device 200 comprises a sacrificial material 220, which may provide a substantially planar surface topography 220S. In one illustrative embodiment, the material 220 may represent any appropriate material that may be deposited in a highly non-conformal manner so as to obtain the enhanced surface topography 220S on the basis of a deposition process. For instance, the material 220 may be applied in a highly viscous state, for instance by spin-on techniques, thereby resulting in a substantially planar surface topography. For example, polymer materials may be applied and may be subsequently treated in order to transit into a non-deformable state, which may be accomplished by well-established curing processes. In some illustrative embodiments, the sacrificial material 220 may have optical characteristics, which provide a high extinction coefficient so as to act as an efficient anti-reflective coating during a subsequent photolithography process. In this case, the material 220 may be applied such that a thickness 220T above the active semiconductor area 202A is appropriate for achieving the required optical behavior. For example, the thickness 220A may be selected such that a desired high degree of absorption may be obtained, while additionally the degree of back reflection into a resist layer to be formed on the sacrificial material 220 may also be reduced.

In other illustrative embodiments, the sacrificial layer 220 may be substantially used for providing the enhanced surface topography 220S, while optical characteristics for a subsequent lithography process may be adjusted separately by a respective anti-reflective coating and an appropriate resist layer. In still other illustrative embodiments, the sacrificial material 220 may be subjected to a further planarization process, such as a CMP process, an appropriately designed etch process and the like, in order to further enhance the degree of planarity of the topography 220S. For example, a CMP process may be performed to reduce height variations, which may still be present after the highly non-conformal deposition process. In other illustrative embodiments, the sacrificial layer 220 may be formed of any other appropriate material, which may additionally be used as a masking material during the patterning of the gate electrode material 206. For example, an appropriate material, such as silicon dioxide and the like, may be deposited on the basis of any appropriate process technique, wherein the layer 220 may not necessarily be deposited in a highly non-conformal fashion. Thereafter, the material layer 220 may be planarized, for instance by CMP, to provide the desired target thickness 220T above the active semiconductor area 202A. Thereafter, the layer 220 may be patterned on the basis of well-established lithography techniques, wherein a respective hard mask feature may be formed on the basis of the material 220, wherein an unwanted portion of the material 220 may also be efficiently removed during this patterning process, for instance by taking advantage of a specific etch selectivity of the material 220 with respect to the gate electrode material 206. Thus, in this case, a highly advanced lithography process may be performed on the enhanced surface topography 220S while, additionally, the actual patterning process for the gate electrode material 206 may be performed on the basis of a respective hard mask feature, thereby also enhancing the etch fidelity of the respective patterning process.

Figure 2B:
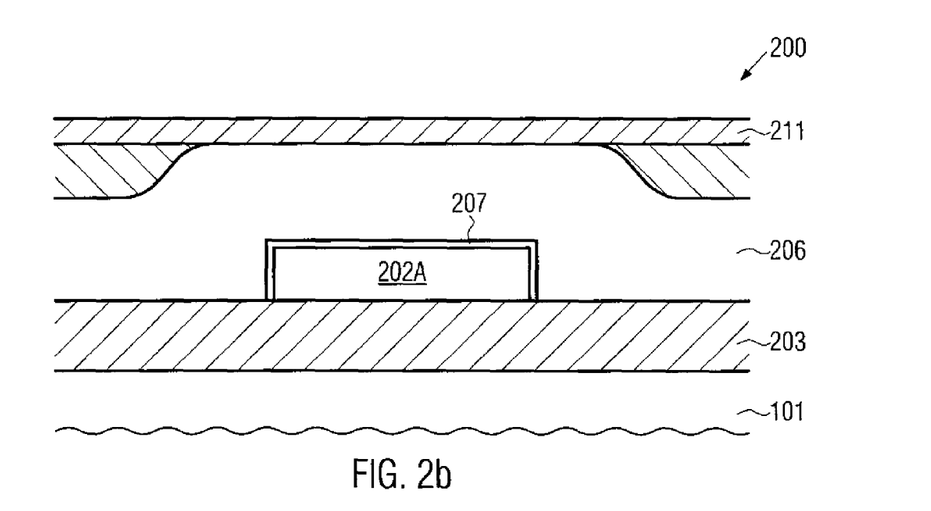
FIG. 2b schematically illustrates a cross-sectional view of a device similar to FIG. 2a according to yet another illustrative embodiment, in which excess material of the sacrificial material is removed.

FIG. 2b schematically illustrates the semiconductor device 200 in accordance with a further illustrative embodiment, wherein, starting from the material layer 220 as shown in FIG. 2a, a corresponding planarization process, such as a CMP process, has been performed to enhance the surface topography, wherein, in the embodiment shown, the corresponding CMP process may be performed to expose the gate electrode material 206 above the respective active semiconductor area 202A. In this manner, a high degree of controllability of the CMP process may be achieved. In other cases, the further planarization process may be stopped so as to leave a specific material thickness above the active semiconductor area 202A, as is also described with reference to FIG. 2a. Thereafter, an ARC layer 211 may be formed on the enhanced surface topography and, based on the ARC layer 211, a standard lithography process may be performed as is also previously described.

Figure 2C:
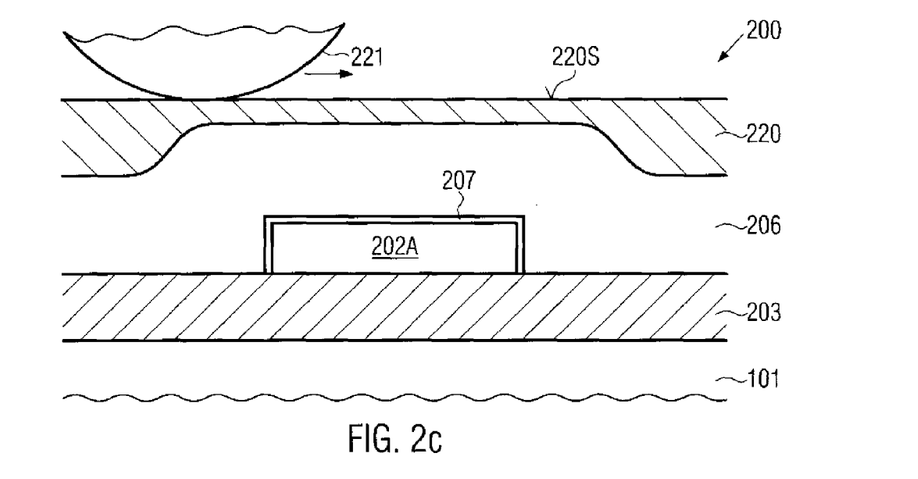
FIG. 2c schematically illustrates a cross-sectional view during a planarization step for a sacrificial material layer on the basis of a deforming roll according to yet other illustrative embodiments.

FIG. 2c schematically illustrates the semiconductor device 200 in accordance with yet other illustrative embodiments. In this embodiment, the sacrificial layer 220 may be provided by any appropriate deposition technique, such as spin-on, chemical vapor deposition (CVD) and the like, in a more or less non-conformal manner to provide a less pronounced surface topography compared to the height differences created by the gate electrode material 206. Thereafter, the sacrificial material 220 may be planarized by mechanical contact with a deforming surface 221, while the material 220 is, at least locally, in a highly deformable state. For example, a plurality of materials are well established which may, for instance, be used in nano-imprint techniques, which may be brought into a highly deformable state, for instance, by an appropriate treatment, such as heating, irradiating and the like, to enable an efficient material redistribution within the layer 220 upon a mechanical contact with the surface 221. In the embodiment shown, the surface 221 may represent a curved surface, such as the surface of an appropriately designed roll, which may be moved across the sacrificial material 220. Consequently, a high degree of planarity may be achieved, which may enhance even more the subsequent optical lithography process, thereby providing the potential for a further device scaling on the basis of an initially pronounced surface topography.

Figure 2D:
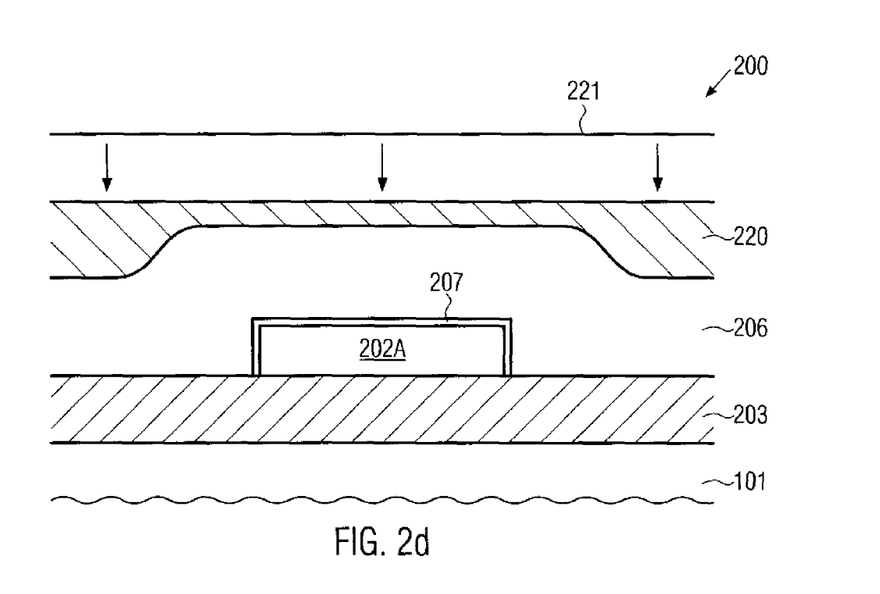
FIG. 2d schematically illustrates the semiconductor device similar to FIG. 2c, wherein an enhanced surface planarity of the sacrificial material layer is obtained by "imprinting" a planar deforming surface according to other illustrative embodiments.

FIG. 2d schematically illustrates the semiconductor device 200 according to an embodiment in which the sacrificial layer 220 is contacted by a planar "imprint" surface 221 so that any surface irregularities may be efficiently removed. After contacting the sacrificial material 220 with the surface 221, the material 220 may be brought into a highly non-deformable state and the surface 221 may be removed. Depending on the size of the surface 221, a high degree of surface planarity may be achieved in a single imprint step, thereby providing high throughput and efficiency of the planarization process.

With reference to FIGS. 3a-3d, further illustrative embodiments will now be described in more detail, wherein the gate patterning process and the patterning process of isolation trenches may be performed on the basis of a highly planar surface topography.

Figure 3A:
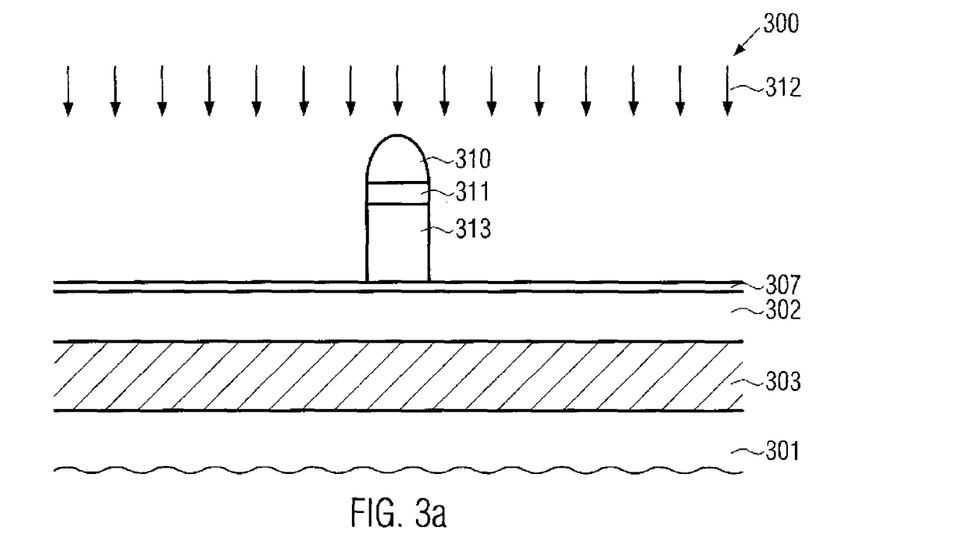
FIGS. 3a-3d schematically illustrate cross-sectional views of a semiconductor device during the patterning of a gate electrode in an isolated semiconductor island, wherein the gate patterning process may be performed on the basis of an enhanced surface topography according to yet other illustrative embodiments disclosed herein.

FIG. 3a schematically illustrates a cross-sectional view of a semiconductor device 300 comprising a substrate 301 having formed thereabove a semiconductor layer 302, which may possibly be formed on a buried insulating layer 303, if required. Moreover, the semiconductor layer 302 may have formed thereon a gate insulation layer 307. With respect to the components described so far, the same criteria may apply as previously explained with reference to the semiconductor devices 100 and 200. Furthermore, in this manufacturing stage, the device 300 may comprise a gate electrode 313, for instance comprised of polysilicon, which may be covered by an ARC layer 311 and the residue of a resist mask 310.

A typical process flow for forming the semiconductor device 300 as shown in FIG. 3a may comprise the following processes. Prior to forming any isolation trench in and on the semiconductor layer 302, the gate insulation layer 307 may be formed by any appropriate process sequence, including oxidation, deposition and the like, and a respective gate electrode material may be formed and may be subjected to a patterning process 312 on the basis of a well-established lithography process which may be based on a respective ARC layer and a resist layer as previously described. Consequently, the lithography process may be performed on a surface topography having a high degree of planarity so that pattern dependent non-uniformities of the lithography process are significantly reduced. Similarly, the actual patterning process 312 for defining the gate electrode 313 may be performed based on the resist feature 310 and the ARC feature 311, each having an increased accuracy due to the superior surface quality. Moreover, the process 312 itself may exhibit an enhanced degree of uniformity due to a substantially planar surface topography. After the process 312, depending on the process requirements, the resist feature 310 and the ARC feature 311 may be removed and, subsequently, a planarization process may be performed to embed the gate electrode 313 into a sacrificial material for providing a substantially planar surface geometry for the subsequent definition of isolation trenches in the semiconductor layer 302.

Figure 3B:
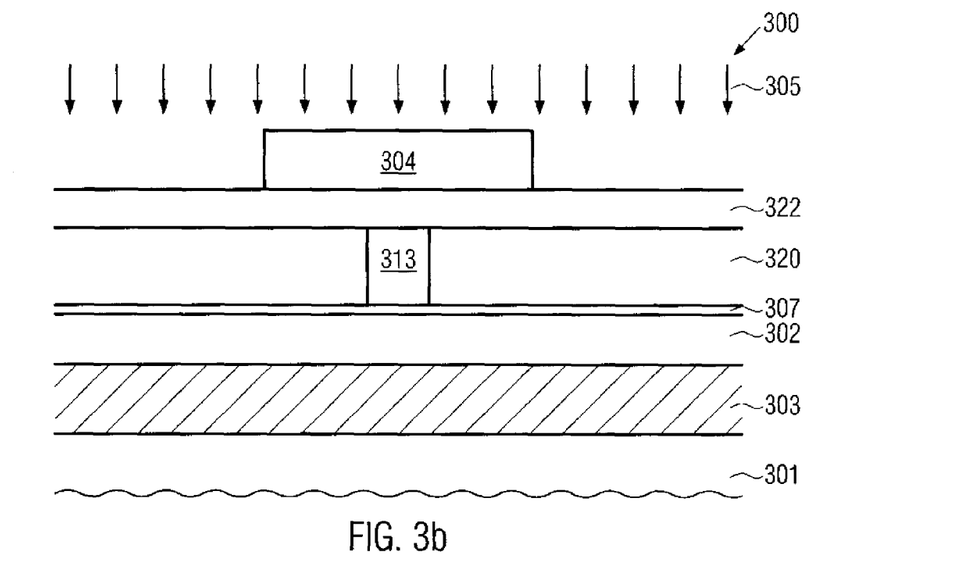

FIG. 3b schematically illustrates the semiconductor device 300 with a sacrificial material 320 formed to at least laterally enclose the gate electrode 313, wherein, in some illustrative embodiments, the sacrificial material 320 may also extend above the gate electrode 313 so as to form an intermediate layer 322, which may, for instance, act as an ARC layer for a subsequent lithography process. For example, the sacrificial material 320 may be comprised of any appropriate polymer material, which may be deposited in a highly non-conformal manner in order to exhibit a superior surface planarity, wherein the intermediate layer 322 may be formed with a desired target thickness. In still other illustrative embodiments, the sacrificial layer 320 may be formed and treated so as to provide a substantially planar surface topography with substantially the same height as the gate electrode 313. Thereafter, the intermediate layer 322 may be formed in a separate process, wherein the underlying substantially planar surface topography may provide a reduced thickness variation of the intermediate layer 322, which may represent an ARC layer or any other appropriate material. Moreover, a resist mask 304 or any other mask material may be formed above the intermediate layer 322 to act as an etch mask during an etch process 305 in order to form respective isolation trenches in the semiconductor layer 302. In one illustrative embodiment, the etch process 305 may be designed to etch through the intermediate layer 322, which may then, depending on the material composition, act as a further etch mask for patterning the sacrificial material 320. Upon exposing the gate insulation layer 307 and removing exposed portions thereof, the etch chemistry of the process 305 may be adapted in any appropriate manner so as to efficiently etch through the layer 302 on the basis of well-established etch recipes.

It should be appreciated that the entire lithography process for forming the resist mask 304 may be performed on the basis of a highly planar surface topography, thereby also increasing accuracy of the lithography process itself as well as of any alignment procedures so that in combination with the previous gate patterning process, a high degree of pattern fidelity may be obtained, thereby providing the potential for further device scaling while nevertheless providing for at least some advantages of a recessed or mesa transistor architecture.

Furthermore, during the process of planarizing the surface geometry on the basis of the patterned gate electrode 313, any further planarization steps may be performed to enhance the planarity of the sacrificial material 320 and/or the intermediate layer 322, as is already described with reference to the embodiments of FIGS. 2a-2d. That is, the sacrificial layer 320, although it may be provided on the basis of a highly non-conformal deposition technique, may further be planarized by CMP, etch processes or mechanical contact with a corresponding deforming surface as is previously described with reference to FIGS. 2c-2d. In some illustrative embodiments, the etch mask 304 may be formed by a nano-imprint technique on the basis of an appropriately patterned imprint die. In still other illustrative embodiments, respective nano-imprint techniques may be used to pattern the sacrificial material 320 itself by providing a respective imprint die for defining respective openings in the sacrificial layer 320 that substantially correspond to the isolation trenches to be formed in the underlying semiconductor layer 302.

Figure 3C:
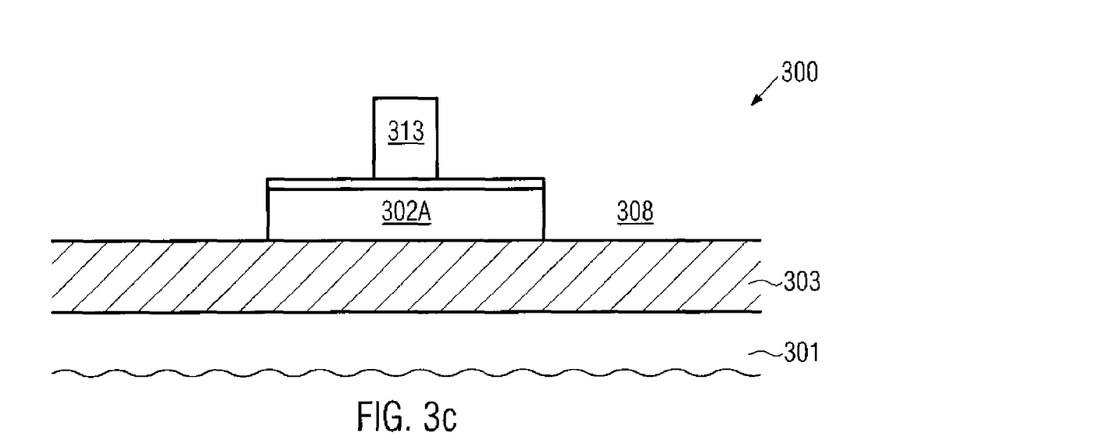

FIG. 3c schematically illustrates the semiconductor device 300 after the completion of the patterning process 305, thereby providing respective isolation trenches 308, which in turn define an active semiconductor area 302A above which is formed the gate electrode 303.

Figure 3D:
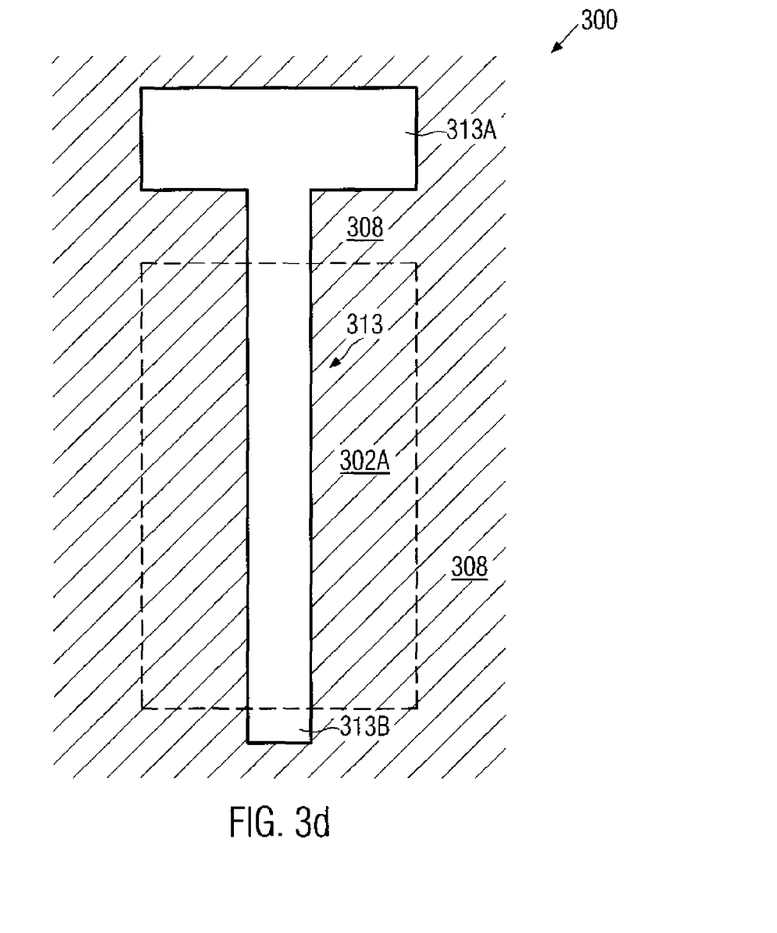

FIG. 3d schematically illustrates a top view of the semiconductor device 300 according to the manufacturing stage as illustrated in FIG. 3c. The gate electrode 303 may comprise first and second end portions 313A, 313B, wherein, for instance, the end portion 313A may comprise a contact area, while the second end portion 313B may terminate or may be connected to a further transistor region (not shown). It should be appreciated that, although the entire gate electrode 313 including the end portions 313A, 313B is formed above the respectively patterned semiconductor area 302A, however electrically insulated therefrom by the gate insulation layer 307, only a central part, as indicated by the dashed lines, may then act as the actual "active" area 302A, which also receives the required dopant concentration in a later stage. Consequently, the actual active area 302A may be connected to high ohmic, i.e., weakly doped, semiconductor areas formed under the end portions 313A, 313B. However, this additional electrical connection of the actually doped drain and source regions may not significantly affect the overall performance of the resulting transistor device, while, nevertheless, the significant advantage of the mesa architecture may be provided, when a highly efficient strain-inducing mechanism may be established due to the formation of an overlying stressed layer, as is also described with reference to FIG. 1i. Thus, based on the device 300 as shown in FIGS. 3c and 3d, the further manufacturing process may continue as is also previously described with reference to the semiconductor device 100. Consequently, some of the significant advantages of the mesa isolation configuration may still be achieved with the process flow as described with reference to FIGS. 3a-3d, while, at the same time, a high degree of process uniformity and, thus, scalability may be achieved due to the superior surface characteristics during the critical gate patterning process and the trench formation process.

As a result, the subject matter disclosed herein provides a technique for the formation of a mesa isolation configuration in transistor devices, wherein one or more of the advantages associated with this process strategy may be maintained, while, at the same time, process non-uniformities may be significantly reduced by providing an enhanced surface topography during at least the gate patterning process. For this purpose, a gate electrode material may be planarized prior to performing a patterning process in order to compensate for any pronounced differences created by a preceding trench formation process. In other illustrative embodiments, a sacrificial material may be used for enhancing the surface planarity, wherein, additionally, etch processes, CMP processes, mechanical imprint techniques and the like may be used in combination with the sacrificial material so as to even further enhance the surface quality. In yet other illustrative embodiments, the gate patterning process may be performed prior to the formation of the isolation trenches, thereby providing excellent surface characteristics for the gate patterning process, while, subsequently, a planarization of the resulting surface topography may be performed in order to also provide a substantially planar surface for the trench patterning process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an isolation trench to define an active semiconductor area in a semiconductor layer formed above a substrate;
   forming a gate insulation layer on said active semiconductor area;
   forming a gate electrode material above said gate insulation layer on said active semiconductor area and within said isolation trench, said gate electrode material having a surface topography;
   forming a sacrificial material on said gate electrode material having said surface topography;
   planarizing said sacrificial material, wherein planarizing said sacrificial material comprises redistributing material on at least an upper surface of said sacrificial material during a deformable state thereof; and
   patterning a gate electrode from said gate electrode material after planarizing said surface topography.

2. The method of claim 1, further comprising providing an anti-reflective coating and a resist layer above said sacrificial layer.

3. The method of claim 1, wherein redistributing material on at least an upper surface of said sacrificial material comprises performing a mechanical imprint process, said mechanical imprint process comprising mechanically contacting said sacrificial material by a deforming surface.

4. The method of claim 3, wherein said deforming surface comprises one of a mechanical die roll having a curved surface and a mechanical die having a planar contact surface.

5. The method of claim 1, wherein redistributing material on at least an upper surface of said sacrificial material comprises controlling a residual thickness of said sacrificial material above said active semiconductor area on the basis of a predefined target value.

6. A method, comprising:
   forming a gate electrode above a semiconductor layer formed above a substrate;
   forming a sacrificial material above said semiconductor layer and said gate electrode, said sacrificial material having a surface topography and at least laterally enclosing said gate electrode;
   planarizing said surface topography of said sacrificial material; and
   after planarizing said surface topography of said sacrificial material, forming an isolation trench in said semiconductor layer to define an active semiconductor area for said gate electrode.

7. The method of claim 6, wherein said sacrificial material is planarized by a polishing process.

8. The method of claim 6, wherein said sacrificial material is planarized by contacting said sacrificial material with a deforming surface.

9. The method of claim 6, further comprising patterning said sacrificial material and using said patterned sacrificial material as an etch mask for forming said isolation trench.

10. The method of claim 9, further comprising forming a hard mask layer prior to forming said sacrificial material and patterning said hard mask layer on the basis of said patterned sacrificial material.

11. A method comprising:
    forming a material layer above an active semiconductor area defined by an isolation trench formed in a semiconductor layer, said material layer comprising a gate insulation layer, a gate electrode material formed above said gate insulation layer, and a sacrificial material layer formed above said gate electrode material;
    planarizing said material layer to provide a substantially planar surface topography, wherein planarizing said material layer comprises performing a mechanical imprint process; and
    patterning said planarized material layer to form a gate electrode above said active semiconductor area.

12. The method of claim 11, wherein said semiconductor layer is formed on a buried insulating layer.

13. The method of claim 11, wherein performing said mechanical imprint process comprises redistributing material on at least an upper surface of said material layer during a deformable state thereof by mechanically contacting said material layer by a deforming surface.

14. The method of claim 13, wherein said deforming surface comprises one of a mechanical die roll having a curved surface and a mechanical die having a planar contact surface.

15. A method, comprising:
    forming an isolation trench to define an active semiconductor area in a semiconductor layer formed above a substrate of a semiconductor device;
    forming a gate electrode material above said active semiconductor area defined by said isolation trench, said gate electrode material having a surface topography;
    planarizing said surface topography of said gate electrode material;
    patterning a gate electrode from said gate electrode material after planarizing said surface topography; and
    forming sidewall spacer structures on all sidewalls of said active semiconductor area.

16. The method of claim 15, further comprising forming a cover layer above said gate electrode, said active semiconductor area, and said substrate of said semiconductor device.

17. The method of claim 16, further comprising forming a contact opening to expose a contact area of said semiconductor device, wherein forming said contact opening comprises using said cover layer as an etch stop layer.

18. The method of claim 16, wherein said cover layer comprises a stressed material layer.

19. The method of claim 15, wherein said sidewall spacer structures formed on sidewalls of said active semiconductor area do not extend to sidewalls of said gate electrode.

20. The method of claim 15, further comprising forming separate sidewall spacer structures on sidewalls of said gate electrode.

* * * * *